United States Patent
Dao et al.

(10) Patent No.: US 9,544,757 B2
(45) Date of Patent: Jan. 10, 2017

(54) SYSTEM AND METHOD FOR REAL TIME VIDEO COMMUNICATION EMPLOYING FOUNTAIN CODING

(71) Applicant: Huawei Technologies Co., Ltd., Shenzhen (CN)

(72) Inventors: Ngoc-Dung Dao, Ottawa (CA); Hang Zhang, Nepean (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 120 days.

(21) Appl. No.: 14/610,614

(22) Filed: Jan. 30, 2015

(65) Prior Publication Data

US 2016/0226529 A1    Aug. 4, 2016

(51) Int. Cl.
| H03M 13/00 | (2006.01) |
| H04W 8/18 | (2009.01) |
| H03M 13/37 | (2006.01) |
| H04L 29/06 | (2006.01) |

(52) U.S. Cl.
CPC ............. *H04W 8/18* (2013.01); *H03M 13/373* (2013.01); *H03M 13/3761* (2013.01); *H04L 65/607* (2013.01)

(58) Field of Classification Search
CPC ............. H04L 29/12735; H04L 65/607; H04L 61/3075; H04L 13/3761; H04L 12/18; H04L 12/184
See application file for complete search history.

(56) References Cited

U.S. PATENT DOCUMENTS

| 2005/0053038 A1 | 3/2005 | Kimura |
| 2007/0189401 A1 | 8/2007 | Watson et al. |
| 2008/0025206 A1 | 1/2008 | Huang et al. |
| 2008/0144724 A1* | 6/2008 | Luo ..................... H03M 13/353 375/240.26 |
| 2008/0189429 A1* | 8/2008 | DaCosta ........... H04L 29/06027 709/231 |
| 2009/0262838 A1 | 10/2009 | Gholmieh et al. |

(Continued)

OTHER PUBLICATIONS

Cataldi et al., Sliding Window Raptor codes for efficient scalable wireless video broadcasting with unequal lost protection, IEEE Trans. on Image Process., vol. 19, No. 6, Jun. 1, 2010, pp. 1491-1503.*

(Continued)

*Primary Examiner* — Shelly A Chase
(74) *Attorney, Agent, or Firm* — Slater Matsil, LLP (57) ABSTRACT

Real-time video can be efficiently and reliably streamed over wireless networks by fountain encoding a stream of video packets at the frame-level. Specifically, deep packet inspection may be performed on the stream of video packets to identify a set of video packets corresponding to an intra-coded frame (I-frame). The set of video packet may then be fountain encoded together as a data segment to produce a set of fountain encoded packets corresponding to the I-frame. Video packets corresponding to other frames (e.g., P-frames, etc.) may also be encoded on a frame-by-frame basis. This may allow a user equipment (UE) to begin displaying earlier frames in a group of pictures (GoP) while fountain encoded packets for subsequent frames are still being received, thereby reducing latency and improving the overall user experience.

39 Claims, 6 Drawing Sheets

(56) References Cited

U.S. PATENT DOCUMENTS

2010/0296428 A1  11/2010 Ho
2012/0246538 A1   9/2012 Wu
2014/0092720 A1   4/2014 Chakraborty et al.
2014/0169261 A1   6/2014 Ming et al.

OTHER PUBLICATIONS

Rai Oh et al., Mesh-pull based P2P Video streaming system using fountain codes, 2011, IEEE, pp. 1 to 6.*
3GPP, 3rd Generation Partnership Project; Technical Specification Group Services and System Aspects; Multimedia Broadcast/Multicast Service (MBMS); Protocols and codecs (Release 11). 3GPP TS 26.346 v11.2.0, Sep. 2009, Technical Specification, 158 pages.
Ahmad, S., et al. "Adaptive Unicast Video Streaming With Rateless Codes and Feedback," IEEE Transactions on Circuits and Systems for Video Technology, vol. 20, No. 2, Feb. 2010, pp. 275-285.

* cited by examiner

SYSTEM AND METHOD FOR REAL TIME VIDEO COMMUNICATION EMPLOYING FOUNTAIN CODING

TECHNICAL FIELD

The present invention relates to the field of wireless communications, and, in particular embodiments, to a system and method for real time video communication employing fountain coding.

BACKGROUND

Real-time video technologies have been emerging rapidly such that video can now be streamed over wireless communication networks. Demand for real-time video streaming services is likely to increase as more and more video-capable terminals are deployed in wireless communication networks. However, reliably and efficiently providing streaming real-time video services may be challenging in some wireless network environments. For example, wireless interfaces that are experiencing multi-path fading and shadowing may produce packet error rates that result in unacceptable video quality. Accordingly, techniques for reliably and efficiently transporting video streams over wireless communication networks are desired.

SUMMARY OF THE INVENTION

Technical advantages are generally achieved, by embodiments of this disclosure which describe system and method for real time video communication employing fountain coding.

In accordance with an embodiment, a method for transmitting real-time video packets in a wireless communication system is provided. In this example, the method includes receiving fountain encoded packets from a gateway. The fountain encoded packets include at least a first set of fountain encoded packets correspond to a video frame in a sequence of video frames. The method further comprises storing the first set of fountain encoded packets in a buffer of the first access point, transmitting at least some fountain encoded packets in the first set of fountain encoded packets over a radio interface extending from the first access point to a user equipment (UE), and receiving an uplink broadcast message from the UE. The uplink broadcast message indicates that the video frame has been successfully decoded by the UE. The method further comprises dropping remaining fountain encoded packets in the first set of fountain encoded packets from the buffer without sending the remaining fountain encoded packets over the radio interface upon receiving the uplink broadcast message indicating that the video frame has been successfully decoded by the UE. An apparatus for performing this method is also provided.

In accordance with another embodiment, a method for receiving real-time video packets in a wireless communication system is provided. In this example, the method comprises receiving a first sub-set of fountain encoded packets from a first access point. The first sub-set of fountain encoded packets correspond to a video frame in a sequence of video frames. The method further comprises decoding the first sub-set of fountain encoded packets to obtain the video frame and transmitting an uplink broadcast message to at least the first access point over a radio interface upon obtaining the video frame. The uplink broadcast message indicates that the UE has obtained the video frame. The uplink broadcast message prompts the first access point to drop remaining fountain encoded packets corresponding to the video frame from a buffer of the first access point without sending the remaining fountain encoded packets over the radio interface. An apparatus for performing this method is also provided.

In accordance with yet another embodiment, a method for communicating real-time video packets in a wireless communication system is provided. In this example, the method includes receiving a stream of video packets destined for a user equipment (UE). A radio interface interconnects the UE to an access point, and a backhaul interface interconnects the access point to the gateway. The method further includes performing deep packet inspection on the stream of video packets to identify at least a first set of video packets associated with a video frame in a sequence of video frames, selecting a coding rate for encoding the video packets in accordance with at least one of a condition on the radio interface and a condition on the backhaul interface, and fountain encoding the first set of video packets in accordance with the selected coding rate to generate a first set of fountain encoded packets corresponding to the video frame. The method further comprises communicating the first set of fountain encoded packets over the backhaul interface to prompt the access point to communicate at least some fountain encoded packets in the first set of fountain encoded packets to the UE over the radio interface. An apparatus for performing this method is also provided.

In accordance with yet another embodiment, a method for distributed fountain encoding of real-time video packets in a wireless communication systems is provided. In this example, the method includes receiving a set of video packets from a gateway. The set of video packets correspond to a video frame in a sequence of video frames. The method further includes fountain encoding the set of video packet to produce fountain encoded packets corresponding to the video frame, and transmitting at least some of the fountain encoded packets over a radio interface extending from a first access point to a user equipment (UE). The method further includes receiving an uplink broadcast message from the UE indicating that the video frame has been successfully decoded by the UE, and cease sending the fountain encoded packets over the radio interface upon receiving the uplink broadcast message indicating that the video frame has been successfully decoded by the UE. An apparatus for performing this method is also provided.

In accordance with yet another embodiment, another method for distributed fountain encoding of real-time video packets in a wireless communication systems is provided. In this example, the method comprises receiving a set of video packets associated with a video frame in a sequence of video frames. The set of video packets being destined for a user equipment (UE). The method further includes multicasting the set of video packets to a group of access points that are adapted to communicate with the UE in accordance with a multi-point transmission scheme, and sending a distributed encoding instruction to the group of access points. The distributed coding instruction prompts each access point in the group of access points to independently fountain encode the set of video packets prior to communicating the resulting fountain encoded packets to the UE in accordance with the multipoint transmission scheme. An apparatus for performing this method is also provided.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims. While much of this disclosure discusses the inventive concepts in the context of real-time video streaming, those of ordinary skill in the art will appreciate that aspects of this disclosure are applicable to video streaming as well. Much of this disclosure discusses lossy video compression in the context of MPEG encoding. However, those of ordinary skill in the art will understand that lossy video compression can be achieved using other encoding techniques, and that aspects of this disclosure can be implemented using any lossy encoding technique. Moreover, different encoding standards make use of different terminology for similar elements. For example, in MPEG encoding, the term I-frame is an abbreviation for intra-coded frame and is used to refer to a frame that stands alone such that all the visual elements of the frame are encoded in the I-frame. The I-frame is often followed by a series of P-frames, with each P-frame encoding the difference between the P-frame and the preceding frame, e.g., the first P-frame encodes difference between frame P-frame and the I-frame, the second P-frame encodes the difference between the second P-frame and the first P-frame, etc. The P-frame encoding utilizes inter-frame prediction to exploit temporal redundancy between neighboring frames, or the fact that visual elements of an image tend to remain static between successive frames. However, in other video encoding formats, such as VP8, similar frame types are present with different names. In the following discussion, reference will be made to frame types as used by the MPEG standard. It should be understood by those skilled in the art that reference to an I-frame is intended to refer to frames having large data content that are used as a baseline for other frames, such as P-frames.

Video streams are typically compressed using inter-frame compression techniques (e.g., inter-frame prediction, etc.) prior to being communicated over a network. During inter-frame compression, a video stream is broken into groups of pictures (GOPs) that include at least one intra-coded frame (I-frame) and one or more inter-coded frames, e.g., predicted picture frames (P-frames), bi-directional predicted picture frames (B-frames), etc. Notably, I-frames are coded independently from other frames in the GoP, and can therefore be decoded without relying on data from the other frames. Conversely, P-frames and B-frames are encoded using motion-compensated information from other frames in the GoP (e.g., from previous decoded I-frames and P-frames). As a result, a video decoder may typically decode an I-frame in a GoP prior to decoding the P-frames and B-frames in the GoP.

Video traffic typically has relatively high-bandwidth requirements in addition to stringent quality of service (QoS) requirements, and can therefore be challenging to transport over wireless interfaces. One strategy for transporting video packets over wireless interfaces is to implement fountain or rateless encoding techniques. More specifically, each GoP in a video stream is first encoded using video compression techniques (e.g., inter-frame prediction, intra-frame prediction, etc.) to obtain a set of video packets corresponding to the GoP. A fountain code is then applied to each set of video packets on a GoP-by-GoP basis to obtain a resulting set of fountain encoded packets corresponding to each GoP. The fountain encoded packets are then communicated over wireless interfaces to a user equipment (UE), where decoding is performed to obtain the corresponding video data. Due to the "rateless" nature of fountain codes, the UE is able to obtain a given GoP upon receiving a threshold number of fountain encoded symbols (e.g., "k" encoded symbols) from the set of fountain encoded packets corresponding to that GoP, regardless of which symbols are received. This is advantageous in wireless network environments because the loss of one or more source symbols does not prevent the UE from obtaining the video stream.

However, conventional fountain encoding techniques have traditionally been considered unsuitable for real-time video applications because they introduce too much delay into the encoding/decoding process, resulting in choppy, low-quality video. More specifically, conventional fountain encoding is performed on a GoP-by-GoP basis such that all frames in a GoP (or set of GoPs) are encoded together as a data segment to produce a set of fountain encoded packets. As a result, the decoder must typically wait until enough fountain encoded symbols are received to decode the entire GoP (or set of GoP) prior to displaying the first frame (e.g., the I-frame) in the GoP. Consequently, the UE may be unable to begin displaying a GoPs until all frames in the GoP have been decoded.

Aspects of this disclosure mitigate the aforementioned decoding delay by performing fountain encoding at the frame-level. More specifically, embodiment techniques encode I-frames in the video stream on a frame-by-frame basis to produce a set of fountain encoded packets that correspond to the I-frame. Other frames in the GoP (e.g., P-frames, B-frames, etc.) may also be fountain encoded on a frame-by-frame basis, or on a multi-frame/group basis. Fountain encoding of the I-frame at the frame level allows the decoder to display the I-frame (e.g., the first frame in the GoP) after receiving enough fountain encoded symbols to decode the I-frame. As a result, the I-frame can be displayed while fountain encoded packets for the remaining frames in the GoP (e.g., the P-frames and B-frames) are still being received. Likewise, the P-frames and B-frames can also be decoded on a frame by frame basis, using the data from previously decoded frames. In other words, leading frames in the GoP can be displayed before trailing frames have been received/decoded.

Aspects of this disclosure also provide signaling to indicate when the I-frame has been decoded. Specifically, the UE may communicate a bounce back message to one or more access points (APs) to indicate when a frame (e.g., an I-frame) has been successfully decoded. The bounce back message may prompt the AP(s) to drop any remaining fountain encoded packets corresponding to the I-frame from their buffers without sending those remaining fountain encoded packets over the radio interface. This improves effective throughput over the radio interface by reducing the amount of redundant data transmitted over that interface. Moreover, it frees up resources that would have otherwise been used to carry the redundant fountain encoded packets corresponding to the I-frame. Those resources can then be used to carry fountain encoded packets corresponding to later frames (e.g., P-frames and B-frames in the same GoP, I-frames in the next GoP, etc.), which may allow the UE to more quickly decode those frames. In some embodiments, fountain encoded packets corresponding to the same or different data stream are communicated to the UE from multiple APs in accordance with a multi-point transmission scheme. In such embodiments, the UE may broadcast the bounce back message to each of the APs participating in the multi-point transmission scheme.

In some embodiments, fountain encoding of video frames is performed by a gateway, e.g. a mobile network gateway, a virtual UE gateway, etc. More specifically, the gateway may perform deep packet inspection (DPI) on an incoming video stream to identify which video packets correspond to which frames (e.g., I-frames, P-frames, and B-frames) of a GoP. The gateway may then perform fountain encoding on a set of video packets corresponding to an I-frame in the GoP to obtain a first set of fountain encoded packets corresponding to the I-frame. Other frames in the GoP may be fountain encoded on a frame-by-frame or group basis to obtain one or more additional sets of fountain encoded packets. The gateway may then send the fountain encoded packets to one or more APs over a backhaul network, where the fountain encoded packets are communicated to the UE. In some embodiments, the gateway may select a coding rate based on conditions of the radio interface and/or the backhaul network connection. In such embodiments, an AP may instruct the gateway to vary the coding rate based on an error rate over the radio interface. In some embodiments, the individual fountain encoded packets may include a header field (or combination of header fields) that indicates the associated video frame. The identifier(s) may allow the UE and the AP to identify which video packets are related to which frames. The identifier(s) may also be included in the bounce back message to identify which frame has been decoded, or obtained, by the UE. These and other aspects are described in greater detail below.

Figure 1:
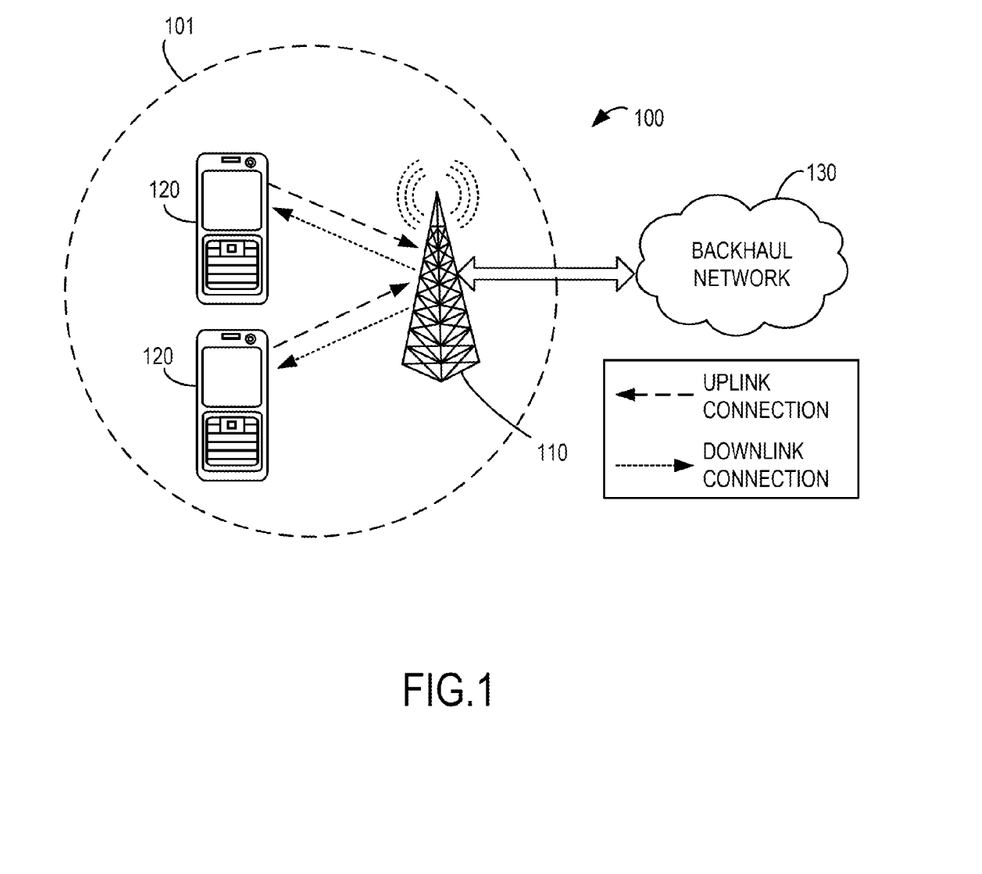
FIG. 1 illustrates a diagram of an embodiment wireless network.

Aspects of this disclosure may be implemented in wireless networks. FIG. 1 illustrates a network 100 for communicating data. The network 100 comprises an access point (AP) 110 having a coverage area 101, a plurality of mobile devices 120, and a backhaul network 130. The AP 110 may comprise any component capable of providing wireless access by, inter alia, establishing uplink (dashed line) and/or downlink (dotted line) connections with the mobile devices 120, such as a base station, an enhanced base station (eNB), a femtocell, and other wirelessly enabled devices. The mobile devices 120 may comprise any component capable of establishing a wireless connection with the AP 110, such as user equipment (UE), a mobile station (STA), or other wirelessly enabled devices. The backhaul network 130 may be any component or collection of components that allow data to be exchanged between the AP 110 and a remote end (not shown). In some embodiments, the network 100 may comprise various other wireless devices, such as relays, low power nodes, etc.

Figure 2:
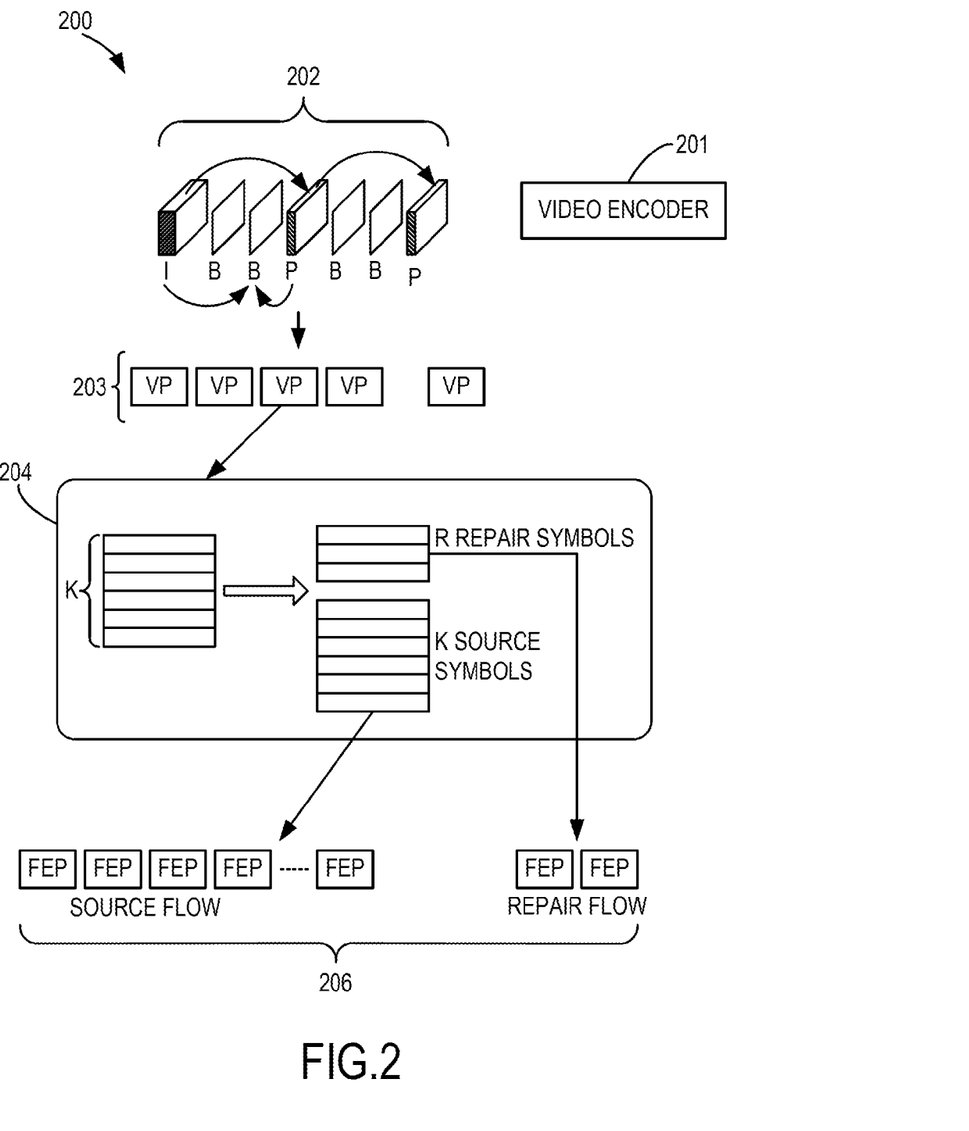
FIG. 2 illustrates a diagram of an embodiment encoding structure for video encoding.

FIG. 2 illustrates a diagram of an embodiment encoding structure 200 for video encoding. As shown, the encoding structure 200 begins when a video encoder 201 encodes a video stream 202 to generate a stream of video packets 203. The video encoder 201 may separate video frames in the video stream 202 into respective groups of pictures (GoPs), and then perform intra-frame prediction on each respective GoP to generate the stream of video packets 203 (denoted "VP" in FIG. 2). During intra-frame prediction, the I-frame in each GoP may be intra-coded, while P-frames and/or B-frames may be inter-coded. In some embodiments, B-frames are not used during real-time video streaming, as B-frames may introduce longer delays than P-frame encoding. In other embodiments, real-time video streaming uses both B-frames and P-frames. The stream of video packets 203 may therefore include sets of packets corresponding to individual frames in the video stream 202. After video encoding, the stream of video packets 203 is encoded by a fountain encoder 204 (e.g., a rateless encoder) to generate fountain encoded packets 206 (denoted "FEP" in FIG. 2). The stream of video packets 203 may be fountain encoded at the GoP level or the frame level. When the stream of video packets 203 is fountain encoded at the GoP level, multiple sets of packets corresponding to the frames in one or more GoPs are encoded together as a data segment to produce a set of fountain encoded packets 206 corresponding to the entire sets of frames in the GoP(s). Conversely, when the stream of video packets 203 is fountain encoded at the frame level, each set of video packets corresponding to each respective video frame in a GoP is encoded as a separate data segment to produce a separate set of fountain encoded packets for each frame. Prior to encoding the stream of video packets 203 at the frame level, deep packet inspection (DPI) may be performed on the stream of video packets 203 to identify which packets correspond to which video frames.

Figure 3:
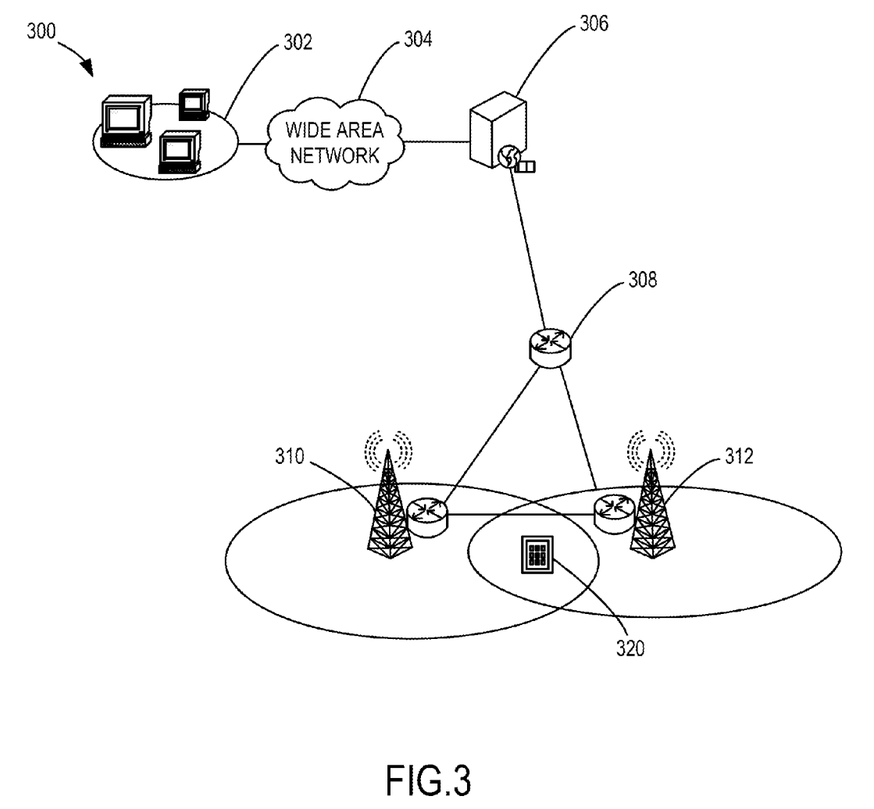
FIG. 3 illustrates a diagram of an embodiment network architecture for supporting real-time video communications.

FIG. 3 illustrates a diagram of an embodiment network architecture 300 for supporting real-time video communications. As shown, the network architecture 300 comprises a content server 302, a wide area network (WAN) 304, a mobile network gateway 306, a virtual UE gateway 308, APs 310, 312, and a UE 320. The content server 302 may generate a stream of video packets, and then transmit the stream of video packets to the mobile network gateway 306 through the WAN 304. The mobile network gateway 306 may then communicate the stream of video packets to a virtual UE gateway 308. The virtual UE gateway 308 may perform DPI on the stream of video packets to identify which video packets correspond to which frames (e.g., I-frames, P-frames, and B-frames) of a GoP. The virtual UE gateway 308 may then perform fountain encoding on respective sets of video packets corresponding to individual video frames to obtain a set of fountain encoded packets corresponding to each individual video frame in the GoP. For example, the virtual UE gateway 308 may perform DPI on the stream of video packets to identify a first set of video packets corresponding to an I-frame in the GoP, as well as additional sets of video packets corresponding to subsequent frames in the GoP, e.g., a second set of video packets corresponding to a P-frame, a third set of video packets corresponding to a B-frame, etc. The virtual UE gateway 308 may then fountain encode at least some of the video packets at the frame level. Specifically, the virtual UE gateway 308 may fountain encode the first set of video packets to obtain a first set of fountain encoded packets corresponding to the I-frame. The additional sets of video packets may also be fountain encoded at the frame level, or as a group, to produce one or more additional set of fountain encoded packets. Notably, the I-frame can be obtained solely from the first set of fountain encoded packets, without relying on encoded symbols from other sets of fountain encoded packets.

The virtual UE gateway 308 may use any type of fountain code. In some embodiments, the virtual UE gateway 308 uses a systematic fountain code. In such embodiment, the first set of fountain encoded packets may include repair packets and source packets. In other embodiments, the virtual UE gateway 308 uses a non-systematic fountain code. In such embodiments, the first set of fountain encoded packets may include generic fountain encoded packets. The virtual UE gateway 308 may also add a frame identifier to the fountain encoded packets in order to specify which frame corresponds to a given fountain encoded packet (or set of fountain encoded packets). The frame identifier may be accompanied by flow identifier (ID), which may identify which flow a particular packet corresponds.

Thereafter, the virtual UE gateway 308 may transmit the fountain encoded packets to the APs 310, 312. The APs 310, 312 may then transmit the fountain encoded packets received from the virtual UE gateway 308 to the UE 320 in accordance with a multi-point transmission scheme. The UE 320 may broadcast a bounce back message (e.g., an uplink broadcast message) to the APs 310, 312 upon determining that a specific frame (e.g., I-frame) has been successfully decoded. When the APs 310, 312 receive the uplink broadcast message from the UE 320, the APs 310, 312 may drop, from their respective buffers, any remaining fountain encoded packets that correspond to the successfully decoded frame, without sending the remaining fountain encoded packets to the UE 320. In some embodiments, the APs 310, 312 may send a control message to the virtual UE gateway 308 to prompt the virtual UE gateway 308 to adjust the encoding rate based on, inter alia, an error rate over the radio interface.

Notably, in the example depicted by FIG. 3, fountain encoding is performed at the virtual UE gateway 308, and the fountain encoded packets are transmitted from the APs 310, 312 to the UE 320 in accordance with a multi-point transmission technique. However, those of ordinary skill in the art will appreciate that FIG. 3 depicts one of the many embodiments covered by this disclosure. For example, the fountain coding could be performed by a different network device, e.g. the mobile network gateway 306. As another example, the fountain encoded packets could be transmitted by a single AP. As yet another example, fountain encoding could be performed at the AP. Other embodiments are also possible.

Figure 4:
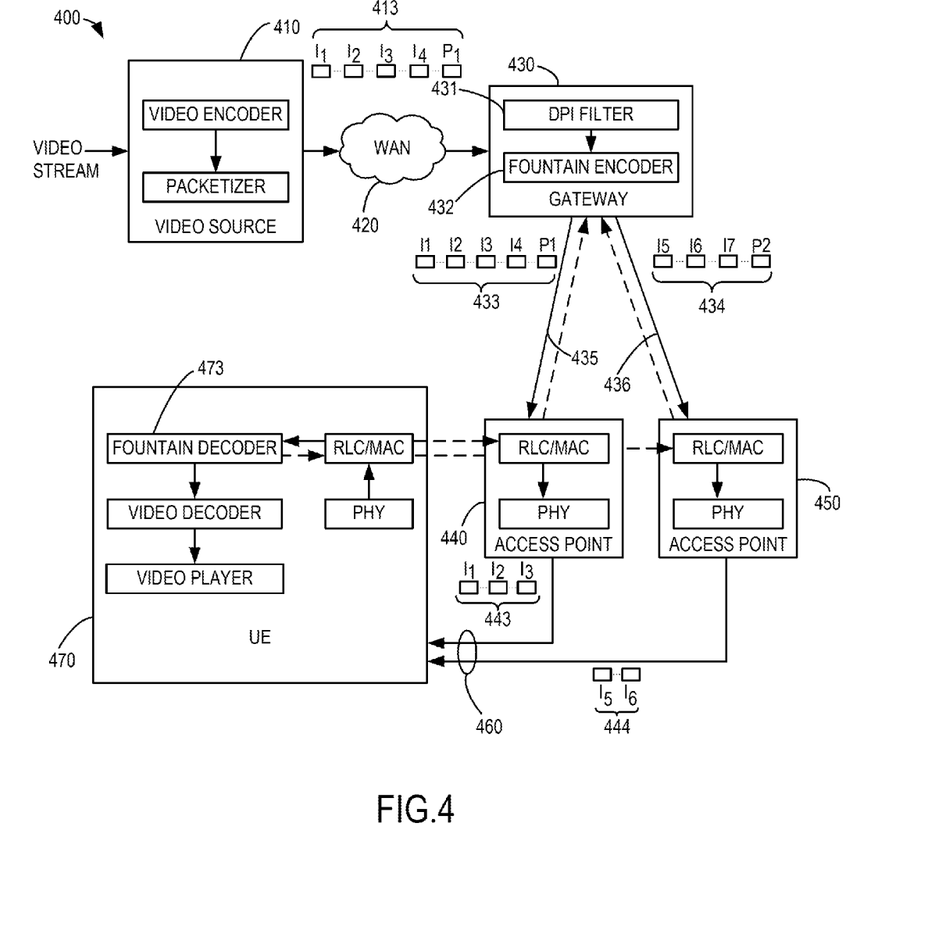
FIG. 4 illustrates a diagram of an embodiment network architecture for supporting real-time video communications.

FIG. 4 illustrates a diagram of an embodiment network architecture 400 for supporting real-time video communications. As shown, the network architecture 400 comprises a video source 410, a wide area network (WAN) 420, a gateway 430, APs 440, 450, radio interfaces 460, and a UE 470. The video source 410 may generate a stream of video packets 413 using a video encoder and a packetizer. The stream of video packets 413 may include sets of packets corresponding to individual frames (I-frame, P-frame etc.) in the video stream, e.g. $I_1, I_2, I_3, I_4$, for the I-frame, . . . $P_1$ for the P-frame, etc. The stream of video packets 413 may be transported to the gateway 430 (e.g. a virtual UE gateway, a mobile network gateway) through the WAN 420. The gateway 430 may analyze the stream of video packets 413 using a deep packet inspection (DPI) filter 431 to identify sets of video packets corresponding to individual video frames (e.g. I-frame, P-frame, etc.). The gateway 430 may then fountain encode the video packets 413 at the frame-level to generate fountain encoded packets 433, 434. When fountain encoding the video packets 413 at the frame level, the gateway 430 fountain encode each respective set of video packets (i.e., packets associated with the same frame) as a data segment to generate a corresponding set of fountain encoded packets for each frame.

Thereafter, the gateway 430 may transmit the fountain encoded packets 433, 434 to the APs 440, 450. Notably, the sets of fountain encoded packets 433, 434 may include different sets of fountain encoded packets corresponding to different frames. For example, one set of fountain encoded packets (I1, I2, I3, I4, I5, I6, I7) may correspond to an I-frame, while another set of fountain encoded packets (P1, P2) may correspond to a P-frame. In some embodiments, the sets of fountain encoded packets 433, 434 are generated using a systematic fountain code, in which case some of the fountain encoded packets are source packets, while other fountain encoded packets are repair packets. For example, fountain encoded packets I1, I2, and I5 may be source packets corresponding to the I-frame, while fountain encoded packets I3, I4, I6, and I7 may be repair packets for the I-frame. Conversely, the sets of fountain encoded packets 433, 434 may be generated using a non-systematic fountain code, in which case the fountain encoded packets 433, 434 may include generic fountain encoded packets, e.g., fountain encoded packets that are not classified as source or repair packets.

The AP 440, 450 may transmit sub-sets of fountain encoded packets 443, 444 to the UE 470 over the radio interfaces 460. The sub-sets of fountain encoded packets 443, 444 may be transmitted via physical (PHY) layer signaling. Notably, some packets from the sub-sets of fountain encoded packets 443, 444 may be lost due to channel conditions of the radio interfaces. Upon reception, the UE 470 may decode at least some of the received fountain encoded packets to obtain an individual video frame (e.g., I-frame), and transmit a bounce back message (e.g., an uplink broadcast message) to the APs 440, 450 indicating that the individual frame has been successfully obtained. The uplink broadcast message may include a combination of information (e.g., a UE ID, a flow ID, and a decoded frame number, etc.) associated with the I-frame.

Upon receiving the uplink broadcast message indicating that the I-frame has been successfully decoded, the APs 440, 450 may drop any remaining fountain encoded packets (e.g., I4, I7, etc.) associated with the I-frame from their buffers without sending the remaining fountain encoded packets to the UE 470. In one embodiment, the fountain encoded packets may include lifetime information provided by the UE 470 for automatic removal from the buffer at the APs 440, 450. In another embodiment, the lifetime information may be provided by other network entities for automatic removal from the buffer.

The APs 440, 450 may transmit a control message to the gateway 430 to prompt the gateway 430 adjust the coding rate of fountain encoded packets in accordance with conditions on the backhaul network connections 435, 436 and/or the radio interfaces 460, e.g., an error rate, available bandwidth etc. The control messages may be periodically transmitted from the APs 440, 450 to the gateway 430 so that the gateway 430 can adjust the coding rate of fountain encoded packets to control redundancy according to network conditions, e.g., conditions on the radio interface 460 and/or the backhaul network connections 435, 436.

Notably, while much of this disclosure discusses fountain encoding all video packets at the frame level, there may be some embodiments that encode video packets corresponding to the I-frame at the frame level without encoding other video packets (e.g., video packets corresponding to the P-frames and B-frames) at the frame level. For example, video packets corresponding to an I-frame in a GoP could be fountain encoded as a first data segment to produce a first set of fountain encoded packets, while video packets corresponding to the remaining frames may be fountain encoded together as a second data segment to produce a second set of fountain encoded packets. Other examples are also possible, e.g., fountain encoding packets corresponding to the I-frame and the P-frame at the frame-level, while fountain encoding packets corresponding to the B-frames collectively.

In some embodiments, fountain encoding may be performed in a distributed fashion. For example, a gateway may multicast a set of video packets corresponding to a frame (e.g., an I-frame) to two or more access points participating in multipoint transmission. In some embodiments, the video packets corresponding to the I-frame may be communicated from the gateway to the access points in one jumbo packet. The gateway may further instruct the access points to process the video packets in accordance with a distributed coding scheme. The distributed coding instruction can be communicated via separate control signaling. Alternatively, the distributed coding instruction can be embedded in the header of the jumbo packet, or the headers of the individual video packets. The distributed coding instruction may prompt the access points to independently perform fountain encoding on the video packets to produce respective sets of fountain encoded packets corresponding to the I-frame. The resulting fountain encoded packets may then be transmitted to a UE. In such embodiments, the access points may continue to generate and send fountain encoded packets for a given frame (e.g., an I-frame) until the UE has received enough fountain encoded packets to decode the frame. Moreover, the respective access points may use different fountain encoding rates than one another, depending on, inter alia, the condition of their respective radio interfaces, e.g., error rate, etc. Distributed fountain encoding may be advantageous in that it avoids incorrect rate allocations between the gateway and the access points. Conversely, centralized fountain encoding (e.g., performed at the gateway) may offer improved backhaul efficiency as well as reduced complexity at the access points.

Figure 5:
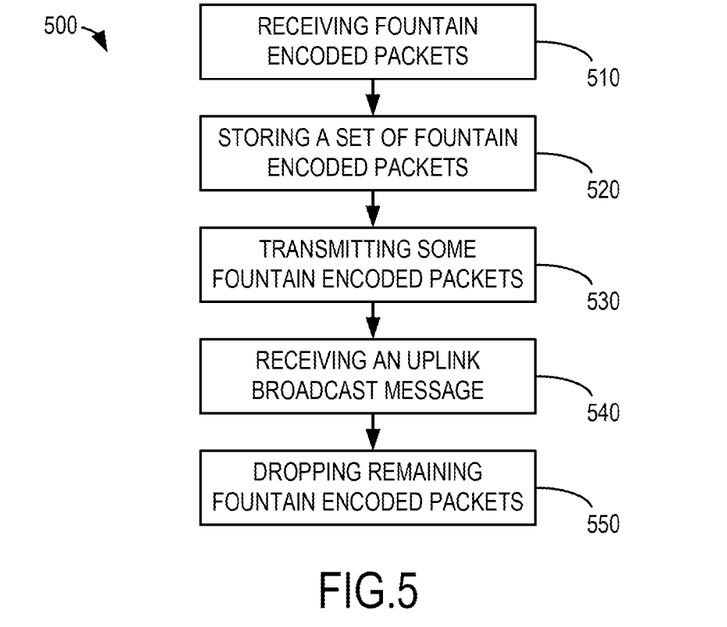
FIG. 5 illustrates a flow chart of an embodiment method for performing real-time video transmission in a wireless communication system.

FIG. 5 illustrates a flow chart of an embodiment method 500 for performing real-time video transmission in a wireless communication system. As shown, the method 500 begins at step 510, where an AP receives fountain encoded packets corresponding to a stream of video packets from a gateway (e.g., a mobile network gateway, a virtual UE gateway, etc.). The fountain encoded packets may have been fountain encoded at the frame level, and may include different sets of fountain encoded packets for different video frame. For example, the fountain encoded packets may include a first set of fountain encoded packets corresponding to an I-frame. Next, the method 500 proceeds to step 520, where the AP stores the fountain encoded packets in a buffer of the AP. Subsequently, the method 500 proceeds to step 530, where the AP transmits some fountain encoded packets in the first set of fountain encoded packets to a UE over a radio interface. Thereafter, the method 500 proceeds to step 540, where the AP receives an uplink broadcast message from the UE indicating that the I-frame has been successfully decoded by the UE. Finally, the method 500 proceeds to step 550, where the AP drops any remaining fountain encoded packets in the first set of fountain encoded packets from the buffer of the AP without sending those remaining fountain encoded packets over the radio interface. These steps are generally carried out in sequence, however, under certain circumstances, there may be parallel aspects among the steps.

Figure 6:
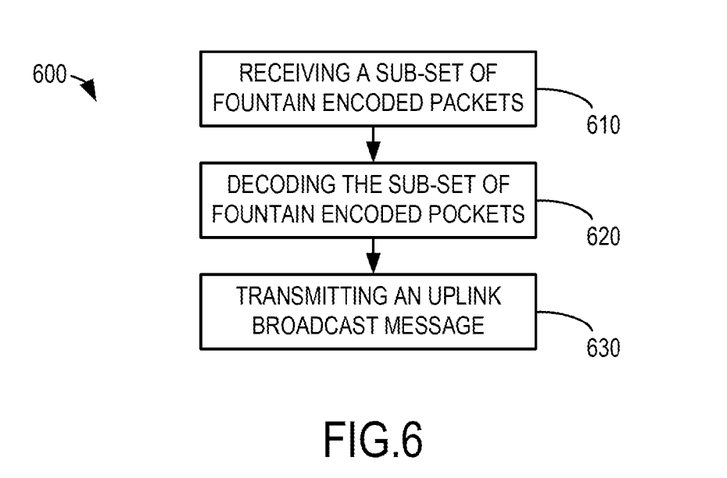
FIG. 6 illustrates a flow chart of an embodiment method for performing real-time video reception in a wireless communication system.

FIG. 6 illustrates a flow chart of an embodiment method 600 for performing real-time video reception in a wireless communication system, as may be performed by a UE. As shown, the method 600 begins at step 610, where a UE receives a sub-set of fountain encoded packets corresponding to an I-frame from an AP over a radio interface. Subsequently, the method 600 proceeds to step 620, where the UE decodes at least a portion of sub-set of fountain encoded packets to obtain the I-frame. Finally, the method 600 proceeds to step 630, where the UE transmits an uplink broadcast message to the AP over the radio interface to indicate that the UE has obtained the I-frame. The uplink broadcast message prompts the AP to drop any remaining fountain encoded packets corresponding to the I-frame from a buffer of the AP without sending the remaining fountain encoded packets over the radio interface. These steps are generally carried out in sequence, however, under certain circumstances, there may be parallel aspects among the steps.

Figure 7:
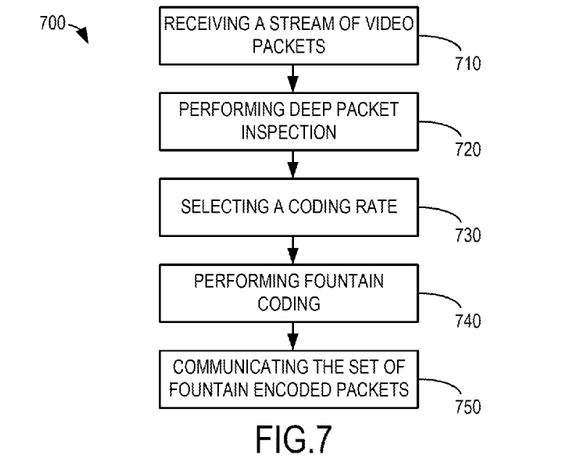
FIG. 7 illustrates a flow chart of an embodiment method for facilitating real-time video communication in a wireless communication system.

FIG. 7 illustrates a flow chart of an embodiment method 700 for facilitating real-time video communication in a wireless communication system, as may be performed by a gateway. As shown, the method 700 begins at step 710, where a gateway (e.g., a mobile network gateway, a virtual UE gateway) receives a stream of video packets destined for a UE from a video source. Next, the method 700 proceeds to step 720, where the gateway performs a DPI on the stream of video packets to identify a set of video packets associated with an I-frame in a GoP. Subsequently, the method 700 proceeds to step 730, where the gateway selects a coding rate for encoding the stream of video packets in accordance with a condition on a radio interface and/or a condition on a backhaul network connection. Thereafter, the method 700 proceeds to step 740, where the gateway performs fountain encoding on the set of video packets in accordance with the selected coding rate to generate a set of fountain encoded packets corresponding to the I-frame. Finally, the method 700 proceeds to step 750, where the gateway communicates the set of fountain encoded packets over the backhaul network connection to an AP, which communicate at least a sub-set of the fountain encoded packets to a UE. These steps are generally carried out in sequence, however, under certain circumstances, there may be parallel aspects among the steps.

Figure 8:
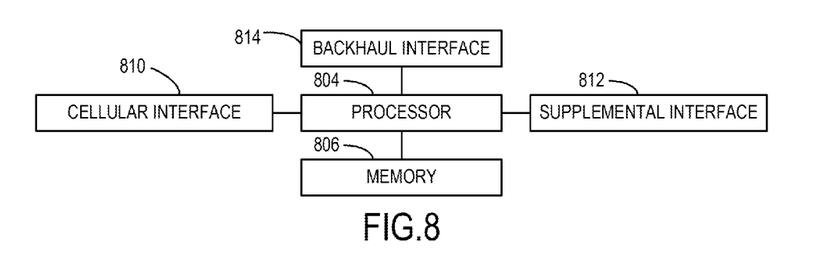
FIG. 8 illustrates a diagram of an embodiment communications device.

FIG. 8 illustrates a block diagram of an embodiment of a communications device 800, which may be equivalent to one or more devices (e.g., requesting devices, candidate devices, network nodes, etc.) discussed above. The communications device 800 may include a processor 804, a memory 806, a cellular interface 810, a supplemental interface 812, and a backhaul interface 814, which may (or may not) be arranged as shown in FIG. 8. The processor 804 may be any component capable of performing computations and/or other processing related tasks, and the memory 806 may be any component capable of storing programming and/or instructions for the processor 804. The cellular interface 810 may be any component or collection of components that allows the communications device 800 to communicate using a cellular signal, and may be used to receive and/or transmit information over a cellular connection of a cellular network. The supplemental interface 812 may be any component or collection of components that allows the communications device 800 to communicate data or control information via a supplemental protocol. For instance, the supplemental interface 812 may be a non-cellular wireless interface for communicating in accordance with a Wireless-Fidelity (Wi-Fi) or Bluetooth protocol. Alternatively, the supplemental interface 812 may be a wireline interface. The backhaul interface 814 may be optionally included in the communications device 800, and may comprise any component or collection of components that allows the communications device 800 to communicate with another device via a backhaul network.

Figure 9:
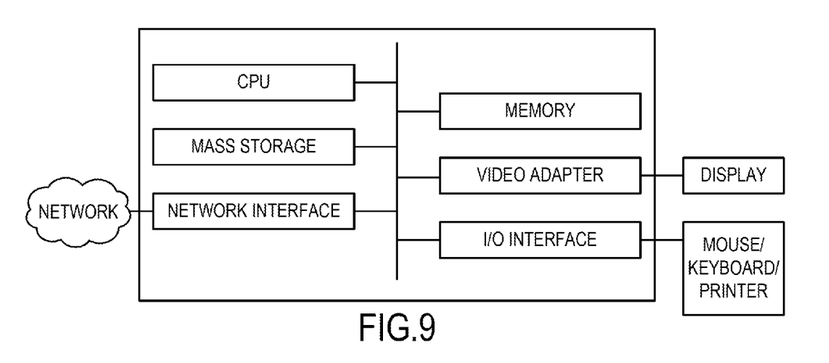
FIG. 9 illustrates a diagram of an embodiment computing platform.

FIG. 9 is a block diagram of a processing system that may be used for implementing the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system may comprise a processing unit equipped with one or more input/output devices, such as a speaker, microphone, mouse, touchscreen, keypad, keyboard, printer, display, and the like. The processing unit may include a central processing unit (CPU), memory, a mass storage device, a video adapter, and an I/O interface connected to a bus.

The bus may be one or more of any type of several bus architectures including a memory bus or memory controller, a peripheral bus, video bus, or the like. The CPU may comprise any type of electronic data processor. The memory may comprise any type of non-transitory system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

The mass storage device may comprise any type of non-transitory storage device configured to store data, programs, and other information and to make the data, programs, and other information accessible via the bus. The mass storage device may comprise, for example, one or more of a solid state drive, hard disk drive, a magnetic disk drive, an optical disk drive, or the like.

The video adapter and the I/O interface provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface such as Universal Serial Bus (USB) (not shown) may be used to provide an interface for a printer.

The processing unit also includes one or more network interfaces, which may comprise wired links, such as an Ethernet cable or the like, and/or wireless links to access nodes or different networks. The network interface allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed:

1. A method for transmitting real-time video packets in a wireless communication system, the method comprising:
   receiving, by a first access point, fountain encoded packets from a gateway, the fountain encoded packets including at least a first set of fountain encoded packets corresponding to a video frame in a sequence of video frames;
   storing the first set of fountain encoded packets in a buffer of the first access point;
   transmitting, by the first access point, at least some fountain encoded packets in the first set of fountain encoded packets over a radio interface extending from the first access point to a user equipment (UE);
   receiving, by the first access point, an uplink broadcast message from the UE, the uplink broadcast message indicating that the video frame has been successfully decoded by the UE; and
   dropping remaining fountain encoded packets in the first set of fountain encoded packets from the buffer without sending the remaining fountain encoded packets over the radio interface upon receiving the uplink broadcast message indicating that the video frame has been successfully decoded by the UE.

2. The method of claim 1, wherein the uplink broadcast message specifies an identifier that is associated with the video frame.

3. The method of claim 2, wherein the uplink broadcast message is communicated over a media access control (MAC) layer of the radio interface.

4. The method of claim 2, wherein the uplink broadcast message is communicated over a radio link control (RLC) layer of the radio interface.

5. The method of claim 1, wherein the fountain encoded packets received from the gateway further include a second set of fountain encoded packets corresponding to predicted picture frames (P-frames) or bi-directional predicted picture frames (B-frames) in the sequence of video frames.

6. The method of claim 5, further comprising:
   transmitting fountain encoded packets in the second set of fountain encoded packets over the radio interface after receiving the uplink broadcast message.

7. The method of claim 5, further comprising:
   transmitting, by the first access point, at least some fountain encoded packets in the second set of fountain encoded packets over the radio interface prior to receiving the uplink broadcast message; and
   continuing to transmit fountain encoded packets from the second set of fountain encoded packets over the radio interface after receiving the uplink broadcast message.

8. The method of claim 1, wherein the first access point and at least a second access point are adapted to communicate the sequence of video frames to the UE in accordance with a multi-point transmission technique, and wherein the uplink broadcast message is broadcast by the UE to at least the first access point and the second access point.

9. The method of claim 1, further comprising:
sending, by the first access point, a message to the gateway, the message prompting the gateway to adjust a coding rate of subsequent fountain encoded packets destined for the UE based on an error rate over the radio interface.

10. The method of claim 1, wherein the first set of fountain encoded packets comprise data packets corresponding to the video frame and repair packets for correcting errors in the data packets.

11. The method of claim 10, wherein each of the data packets are transmitted over the radio interface prior to receiving the uplink broadcast message, and
wherein at least some of the repair packets are dropped from the buffer after receiving the uplink broadcast message.

12. A first access point comprising:
a processor; and
a non-transitory memory storing programming for execution by the processor, the programming including instructions to:
receive fountain encoded packets from a gateway, the fountain encoded packets including at least a first set of fountain encoded packets corresponding to a video frame in a sequence of video frames;
store the first set of fountain encoded packets in a buffer of the first access point;
transmitting, by the first access point, at least some fountain encoded packets in the first set of fountain encoded packets over a radio interface extending from the first access point to a user equipment (UE);
receive an uplink broadcast message from the UE, the uplink broadcast message indicating that the video frame has been successfully decoded by the UE; and
drop remaining fountain encoded packets in the first set of fountain encoded packets from the buffer without sending the remaining fountain encoded packets over the radio interface upon receiving the uplink broadcast message indicating that the video frame has been successfully decoded by the UE.

13. The first access point of claim 12, wherein the uplink broadcast message specifies an identifier that is associated with the video frame and is communicated over a media access control (MAC) layer of the radio interface.

14. The first access point of claim 12, wherein the uplink broadcast message specifies an identifier that is associated with the video frame and is communicated over a radio link control (RLC) layer of the radio interface.

15. The first access point of claim 12, wherein the fountain encoded packets received from the gateway further include a second set of fountain encoded packets corresponding to predicted picture frames (P-frames) or bi-directional predicted picture frames (B-frames) in the sequence of video frames.

16. The first access point of claim 15, wherein the programming further includes instructions to:
transmit fountain encoded packets in the second set of fountain encoded packets over the radio interface after receiving the uplink broadcast message.

17. The first access point of claim 15, wherein the programming further includes instructions to:
transmit at least some fountain encoded packets in the second set of fountain encoded packets over the radio interface prior to receiving the uplink broadcast message; and
continue to transmit fountain encoded packets from the second set of fountain encoded packets over the radio interface after receiving the uplink broadcast message.

18. The first access point of claim 12, wherein the first access point and at least a second access point are adapted to communicate the sequence of video frames to the UE in accordance with a multi-point transmission technique, and wherein the uplink broadcast message is broadcast by the UE to at least the first access point and the second access point.

19. The first access point of claim 12, wherein the programming further includes instructions to:
send a message to the gateway, the message prompting the gateway to adjust a coding rate of subsequent fountain encoded packets destined for the UE based on an error rate over the radio interface.

20. The first access point of claim 12, wherein the first set of fountain encoded packets comprise data packets corresponding to the video frame and repair packets for correcting errors in the data packets,
wherein each of the data packets are transmitted over the radio interface prior to receiving the uplink broadcast message, and
wherein at least some of the repair packets are dropped from the buffer after receiving the uplink broadcast message.

21. A method for receiving real-time video packets in a wireless communication system, the method comprising:
receiving, by a user equipment (UE), a first sub-set of fountain encoded packets from a first access point, the first sub-set of fountain encoded packets corresponding to a video frame in a sequence of video frames;
decoding, by the UE, the first sub-set of fountain encoded packets to obtain the video frame; and
transmitting an uplink broadcast message to at least the first access point over a radio interface upon obtaining the video frame, the uplink broadcast message indicating that the UE has obtained the video frame, wherein the uplink broadcast message prompts the first access point to drop remaining fountain encoded packets corresponding to the video frame from a buffer of the first access point without sending the remaining fountain encoded packets over the radio interface.

22. The method of claim 21, wherein the uplink broadcast message specifies an identifier that is associated with the video frame.

23. The method of claim 22, wherein the uplink broadcast message is communicated over a media access control (MAC) layer of the radio interface.

24. The method of claim 22, wherein the uplink broadcast message is communicated over a radio link control (RLC) layer of the radio interface.

25. The method of claim 21, further comprising:
receiving, by the UE, a second sub-set of fountain encoded packets after transmitting the uplink broadcast message, the second sub-set of fountain encoded packets corresponding to predicted picture frames (P-frames) or bi-directional predicted picture frames (B-frames) in the sequence of video frames.

26. The method of claim 21, wherein the uplink broadcast message is broadcast by the UE to at least the first access point and a second access point, the first access point and the second access point being adapted to communicate the sequence of video frames to the UE in accordance with a multi-point transmission technique.

27. The method of claim 21, wherein the first sub-set of fountain encoded packets comprise data packets corresponding to the video frame and repair packets for correcting errors in the data packets.

28. A user equipment (UE) comprising:
a processor; and
a non-transitory memory storing programming for execution by the processor, the programming including instructions to:
receive fountain encoded packets corresponding to a sequence of video frames from a first access point, the fountain encoded packets including at least a first sub-set of fountain encoded packets corresponding to a video frame in the sequence of video frames;
decode the first sub-set of fountain encoded packets to obtain the video frame; and
transmit an uplink broadcast message to at least the first access point over a radio interface upon obtaining the video frame, the uplink broadcast message indicating that the UE has obtained the video frame, wherein the uplink broadcast message prompts the first access point to drop remaining fountain encoded packets corresponding to the video frame from a buffer of the first access point without sending the remaining fountain encoded packets over the radio interface.

29. The UE of claim 28, wherein the uplink broadcast message specifies an identifier that is associated with the video frame and is communicated over a media access control (MAC) layer of the radio interface.

30. The UE of claim 28, wherein the uplink broadcast message specifies an identifier that is associated with the video frame and is communicated over a radio link control (RLC) layer of the radio interface.

31. The UE of claim 28, wherein the programming further includes instructions to:
receive a second sub-set of fountain encoded packets after transmitting the uplink broadcast message, the second sub-set of fountain encoded packets corresponding to predicted picture frames (P-frames) or bi-directional predicted picture frames (B-frames) in the sequence of video frames.

32. The UE of claim 28, wherein the uplink broadcast message is broadcast by the UE to at least the first access point and a second access point, the first access point and the second access point being adapted to communicate the sequence of video frames to the UE in accordance with a multi-point transmission technique.

33. The UE of claim 28, wherein the first sub-set of fountain encoded packets comprise data packets corresponding to the video frame and repair packets for correcting errors in the data packets.

34. A computer program product comprising a non-transitory computer readable storage medium storing programming, the programming including instructions to:
receive, at a first access point, fountain encoded packets from a gateway, the fountain encoded packets including at least a first set of fountain encoded packets corresponding to a video frame in a sequence of video frames;
store the first set of fountain encoded packets in a buffer of the first access point;
transmitting, by the first access point, at least some fountain encoded packets in the first set of fountain encoded packets over a radio interface extending from the first access point to a user equipment (UE);
receive an uplink broadcast message from the UE, the uplink broadcast message indicating that the video frame has been successfully decoded by the UE; and
drop remaining fountain encoded packets in the first set of fountain encoded packets from the buffer without sending the remaining fountain encoded packets over the radio interface upon receiving the uplink broadcast message indicating that the video frame has been successfully decoded by the UE.

35. A first access point comprising:
a receiver configured to receive fountain encoded packets from a gateway, the fountain encoded packets including at least a first set of fountain encoded packets corresponding to a video frame in a sequence of video frames;
at least one processor configured to store the first set of fountain encoded packets in a buffer of the first access point; and
a transmitter configured to transmit at least some fountain encoded packets in the first set of fountain encoded packets over a radio interface extending from the first access point to a user equipment (UE),
wherein the receiver is further configured to receive an uplink broadcast message from the UE, the uplink broadcast message indicating that the video frame has been successfully decoded by the UE, and
wherein the at least one processor is configured to drop remaining fountain encoded packets in the first set of fountain encoded packets from the buffer without sending the remaining fountain encoded packets over the radio interface upon receiving the uplink broadcast message indicating that the video frame has been successfully decoded by the UE.

36. A first access point comprising:
a means for receiving fountain encoded packets from a gateway, the fountain encoded packets including at least a first set of fountain encoded packets corresponding to a video frame in a sequence of video frames;
a means for storing the first set of fountain encoded packets in a buffer of the first access point;
a means for transmitting at least some fountain encoded packets in the first set of fountain encoded packets over a radio interface extending from the first access point to a user equipment (UE);
a means for receiving an uplink broadcast message from the UE, the uplink broadcast message indicating that the video frame has been successfully decoded by the UE; and
a means for dropping remaining fountain encoded packets in the first set of fountain encoded packets from the buffer without sending the remaining fountain encoded packets over the radio interface upon receiving the uplink broadcast message indicating that the video frame has been successfully decoded by the UE.

37. A computer program product comprising a non-transitory computer readable storage medium storing programming, the programming including instructions to:
receive, at a user equipment (UE), fountain encoded packets corresponding to a sequence of video frames from a first access point, the fountain encoded packets including at least a first sub-set of fountain encoded packets corresponding to a video frame in the sequence of video frames;
decode the first sub-set of fountain encoded packets to obtain the video frame; and
transmit an uplink broadcast message to at least the first access point over a radio interface upon obtaining the video frame, the uplink broadcast message indicating that the UE has obtained the video frame, wherein the uplink broadcast message prompts the first access point to drop remaining fountain encoded packets corresponding to the video frame from a buffer of the first access point without sending the remaining fountain encoded packets over the radio interface.

38. A user equipment (UE) comprising:

a receiver configured to receive fountain encoded packets corresponding to a sequence of video frames from a first access point, the fountain encoded packets including at least a first sub-set of fountain encoded packets corresponding to a video frame in the sequence of video frames;

at least one processor configured to decode the first sub-set of fountain encoded packets to obtain the video frame; and a transmitter configured to transmit an uplink broadcast message to at least the first access point over a radio interface upon obtaining the video frame, the uplink broadcast message indicating that the UE has obtained the video frame, wherein the uplink broadcast message prompts the first access point to drop remaining fountain encoded packets corresponding to the video frame from a buffer of the first access point without sending the remaining fountain encoded packets over the radio interface.

39. A user equipment (UE) comprising:

a means for receiving a first sub-set of fountain encoded packets from a first access point, the first sub-set of fountain encoded packets corresponding to a video frame in a sequence of video frames;

a means for decoding the first sub-set of fountain encoded packets to obtain the video frame; and a means for transmitting an uplink broadcast message to at least the first access point over a radio interface upon obtaining the video frame, the uplink broadcast message indicating that the UE has obtained the video frame, wherein the uplink broadcast message prompts the first access point to drop remaining fountain encoded packets corresponding to the video frame from a buffer of the first access point without sending the remaining fountain encoded packets over the radio interface.

\* \* \* \* \*